United States Patent
Whit et al.

(10) Patent No.: US 7,120,023 B2
(45) Date of Patent: Oct. 10, 2006

(54) METHOD OF ASSEMBLY OF A WEDGE THERMAL INTERFACE TO ALLOW EXPANSION AFTER ASSEMBLY

(75) Inventors: Joseph M. Whit, Windsor, CO (US); Andrew D. Delano, Fort Collins, CO (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 282 days.

(21) Appl. No.: 10/649,518

(22) Filed: Aug. 25, 2003

(65) Prior Publication Data

US 2005/0047092 A1 Mar. 3, 2005

(51) Int. Cl.
*H05K 7/20* (2006.01)

(52) U.S. Cl. ............... 361/704; 165/185; 257/707; 257/719; 361/710

(58) Field of Classification Search ........ 257/706–707, 257/712–713, 718–719; 165/80.2, 80.3; 361/704, 707, 710
See application file for complete search history.

(56) References Cited

U.S. PATENT DOCUMENTS

| | | | | |
|---|---|---|---|---|
| 3,366,171 A | * | 1/1968 | Scharli | 165/80.3 |
| 3,804,676 A | * | 4/1974 | Sell, Jr. | 136/205 |
| 4,414,605 A | * | 11/1983 | Chino et al. | 361/707 |
| 4,867,235 A | * | 9/1989 | Grapes et al. | 165/185 |
| 4,872,089 A | * | 10/1989 | Ocken et al. | 361/710 |
| 4,953,059 A | * | 8/1990 | McNulty | 361/720 |
| 5,162,974 A | * | 11/1992 | Currie | 361/702 |
| 5,184,281 A | * | 2/1993 | Samarov et al. | 361/704 |
| 5,887,435 A | * | 3/1999 | Morton | 62/3.6 |
| 6,480,386 B1 | * | 11/2002 | Yu | 361/704 |

OTHER PUBLICATIONS

White, Joseph M., et al., "Variable Height Thermal Interface," U.S. Appl. No. 10/649,519, filed Aug. 25, 2003 concurrently herewith.
Rubenstein, Brandon A., Heat Sink Hold-Down with Fan-Module Attach Location,: U.S. Appl. No. 10/419,386, filed Apr. 21, 2003.
Delano, Andrew D., et al., "Variable-Gap Thermal-Interface Device," U.S. Appl. No. 10/419,373, filed Apr. 21, 2003.
Delano, Andrew D., et al., "Variable-Wedge Thermal-Interface Device," U.S. Appl. No. 10/419,406, filed Apr. 21, 2003.
Belady, Christian L., et al., Thermal Transfer Interface System and Methods, U.S. Appl. No. 10/074,642, filed Feb. 12, 2002.

* cited by examiner

*Primary Examiner*—Gregory D Thompson

(57) ABSTRACT

A variable-height thermal-interface assembly for transferring heat from a heat source to a heat sink comprises a slidable interface between two contacting surfaces, the slidable interface inclined diagonally relative to the z-axis. The two contacting surfaces slide relative to one another parallel to the incline direction to provide z-axis expansion of the assembly. The assembly further comprises a spring clip, which when released applies a shear force across the slidable interface, causing the two contacting surfaces to slide relative to one another, coupling the sliding to provide z-axis expansion. The assembly further comprises a reversible locking device, which when locked prevents the two contacting surfaces from sliding relative to one another, such that the spring clip remains retracted, and when unlocked allows the two contacting surfaces to slide relative to one another, such that the spring clip is released.

30 Claims, 9 Drawing Sheets

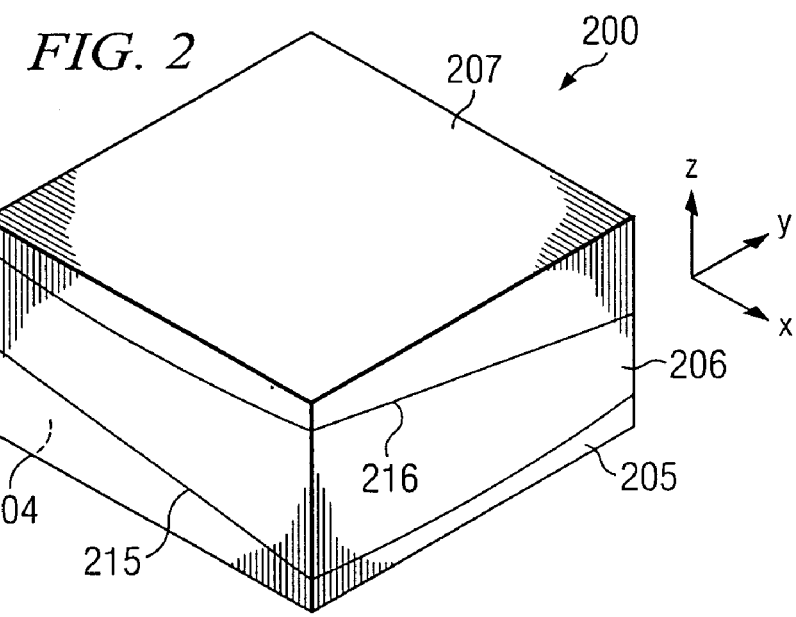
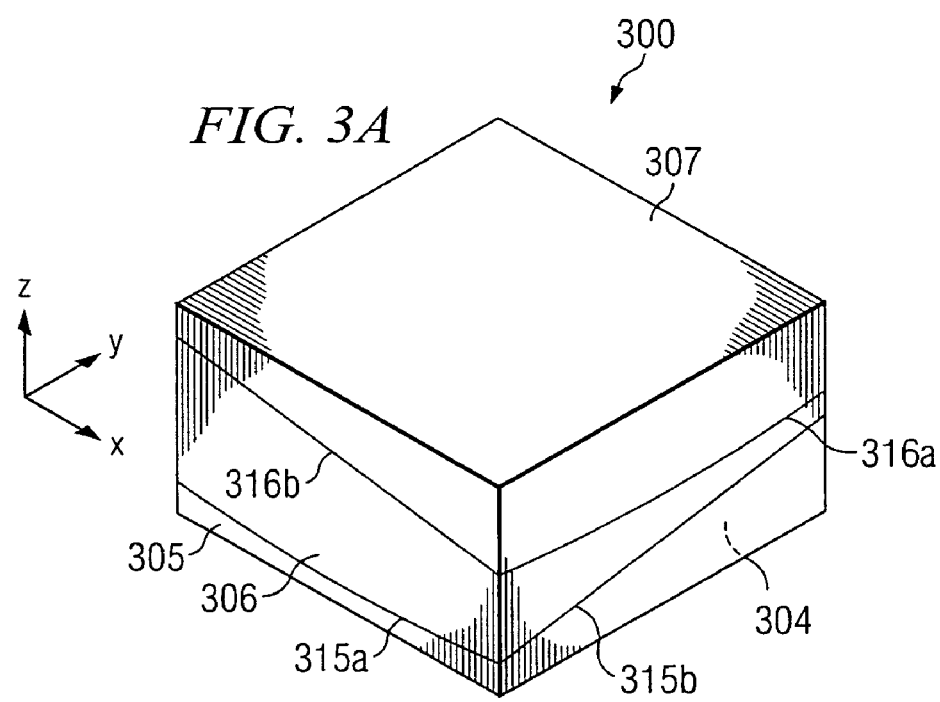

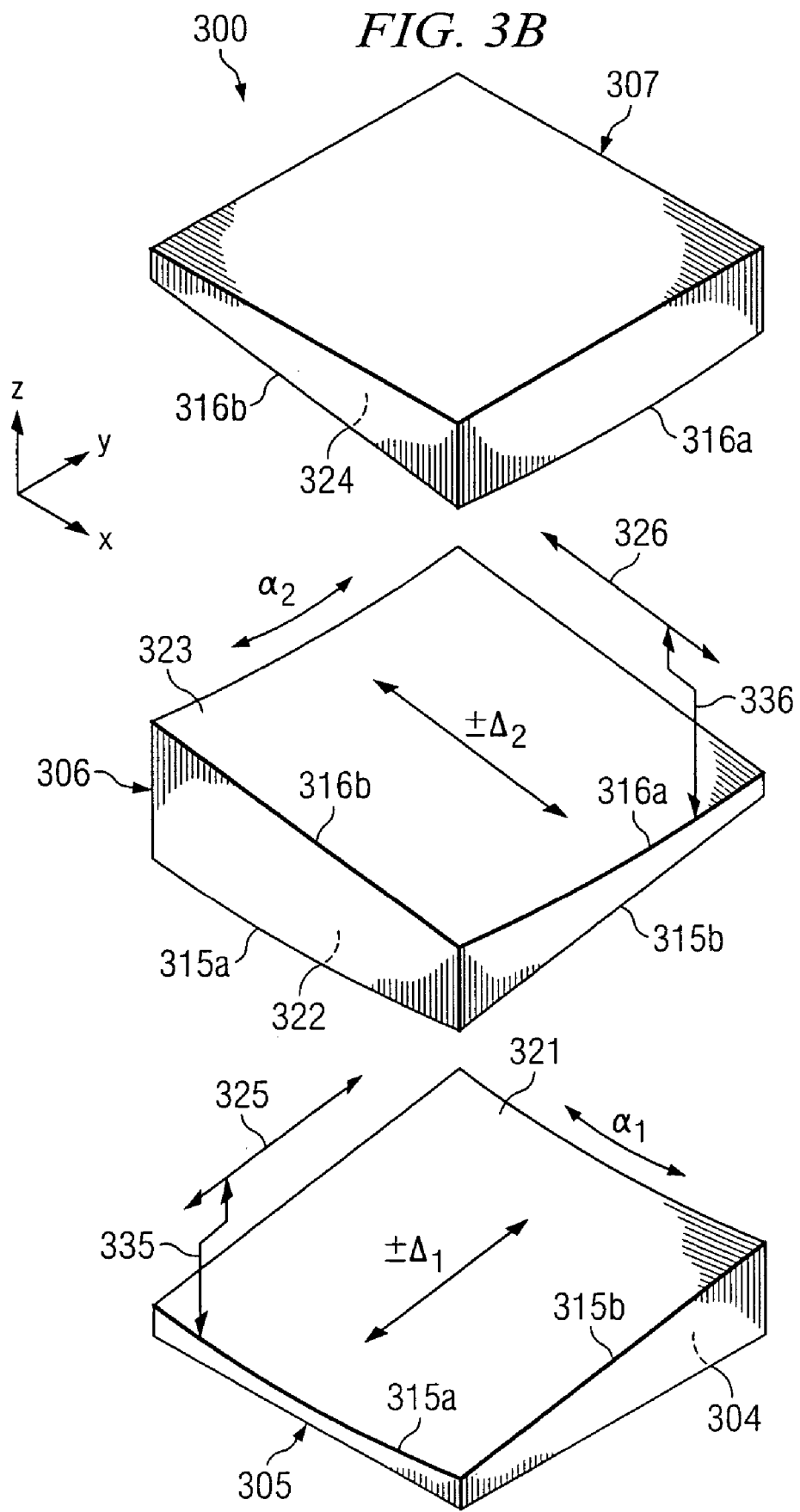

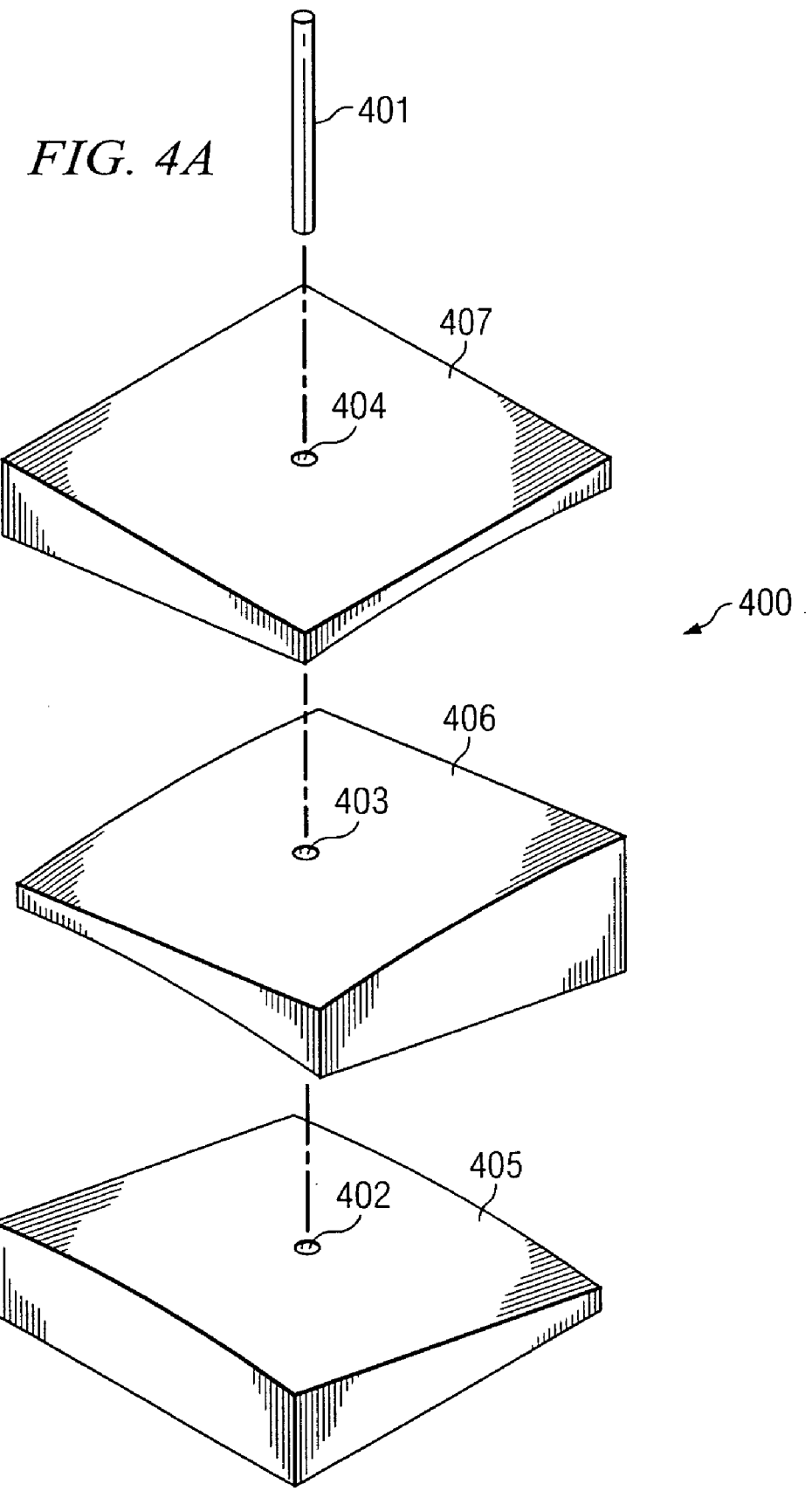

METHOD OF ASSEMBLY OF A WEDGE THERMAL INTERFACE TO ALLOW EXPANSION AFTER ASSEMBLY

CROSS-REFERENCE TO RELATED APPLICATIONS

This application is related to concurrently filed, co-pending, and commonly assigned U.S. patent application Ser. No. 10/649,519, titled "VARIABLE HEIGHT THERMAL INTERFACE"; co-pending and commonly assigned U.S. patent application Ser. No. 10/419,386, titled "HEAT SINK HOLD-DOWN WITH FAN-MODULE ATTACH LOCATION," filed Apr. 21, 2003; co-pending and commonly assigned U.S. patent application Ser. No. 10/419,373, titled "VARIABLE-GAP THERMAL-INTERFACE DEVICE," filed Apr. 21, 2003; co-pending and commonly assigned U.S. patent application Ser. No. 10/419,406, titled "VARIABLE-WEDGE THERMAL-INTERFACE DEVICE," filed Apr. 21, 2003; and co-pending and commonly assigned U.S. patent application Ser. No. 10/074,642, titled THERMAL TRANSFER INTERFACE SYSTEM AND METHODS," filed Feb. 12, 2002; the disclosures of all of which are hereby incorporated herein by reference.

FIELD OF THE INVENTION

This invention relates to heat transfer and more particularly to a variable height thermal interface.

DESCRIPTION OF THE RELATED ART

There are circumstances in which a heat sink is fixed at a set distance above a heat source, for example a processor or other active electronic device. Due to variations in thickness of the parts, primarily the active device, a gap of unknown height may exist between the heat sink and the active device. There is then a need for a thermal interface to fill the gap and concurrently provide good heat transfer properties.

Traditionally, heat has been transferred between a heat source and a heat sink across non-uniform width gaps through the use of "gap pads," or silicone-based elastic pads. For example, The Bergquist Company (see web page http://www.bergquistcompany.com/tm_gap_list.cfm and related web pages) offers a range of conformable, low-modulus filled silicone elastomer pads of various thickness on rubber-coated fiberglass carrier films. This material can be used as a thermal-interface, where one side of the interface is in contact with an active electronic device. Relative to metals, these pads have low thermal conductivity. Furthermore, large forces are generally required to compress these pads. Moreover, silicone-based gap pads cannot withstand high temperatures.

BRIEF SUMMARY OF THE INVENTION

In accordance with an embodiment disclosed herein, a variable-height thermal-interface assembly is provided for transferring heat from a heat source to a heat sink. The assembly comprises a first slidable interface between two contacting surfaces, the slidable interface inclined diagonally relative to a z-axis parallel to the shortest distance between the heat source and the heat sink. The two contacting surfaces are operable to slide relative to one another parallel to the direction of the incline to provide z-axis expansion of the thermal interface assembly. The assembly further comprises a spring clip mechanically spring loading the slidable interface, the spring clip operable when released to apply a shear force across the slidable interface. The shear force causes the two contacting surfaces to slide relative to one another, coupling the sliding to provide z-axis expansion. The assembly further comprises a reversible locking device, operable when in a locked condition to prevent the two contacting surfaces from sliding relative to one another, such that the spring clip remains retracted. The reversible locking device is operable when in an unlocked condition to allow the two contacting surfaces to slide relative to one another, such that the spring clip is released.

In another embodiment disclosed herein, a method of installing a variable-height thermal-interface assembly for transferring heat from a heat source to a heat sink is provided. The method comprises providing a first slidable interface between two contacting surfaces, the slidable interface inclined diagonally relative to a z-axis parallel to the shortest distance between said heat source and said heat sink. The two contacting surfaces are operable to slide relative to one another parallel to the direction of the incline to provide z-axis expansion of the thermal interface assembly. The method further comprises spring loading the slidable interface using a spring clip to apply a shear force across the slidable interface, retracting the spring-loaded slidable interface to its most retracted condition, and locking the retracted spring-loaded slidable interface reversibly in its most retracted condition. The method further comprises installing the reversibly locked retracted spring-loaded slidable interface relative to the heat source. The method further comprises unlocking the reversibly locked retracted spring-loaded slidable interface, thus releasing the spring-loaded shear force and causing the two contacting surfaces to slide relative to one another, coupling the sliding to provide z-axis expansion of the thermal interface assembly.

In yet another embodiment disclosed herein, a variable-height thermal-interface assembly is provided for transferring heat from a heat source to a heat sink. The assembly comprises a first slidable interface between two contacting surfaces. The slidable interface is inclined diagonally relative to a z-axis parallel to the shortest distance between said heat source and said heat sink. The two contacting surfaces are operable to slide relative to one another parallel to the direction of incline to provide z-axis expansion of the thermal interface assembly. The assembly further comprises a reversible locking device comprising a locking cam mechanism, operable when released to cause relative sliding motion of the two contacting surfaces and operable when locked to apply spring loading across the slidable interface.

BRIEF DESCRIPTION OF THE DRAWINGS

FIG. 2 is a perspective view of an embodiment illustrating a cascaded variable-wedge thermal-interface device, in which two or more wedge structures similar to variable-wedge thermal-interface devices depicted in FIGS. 1A and 1B are stacked or cascaded in the z-direction;

FIG. 3A is a perspective view of an embodiment illustrating an assembled variable-height thermal-interface device, including at least one single-axis rotary cylindrical joint;

FIG. 3B is an exploded perspective view of the embodiment of variable-height thermal-interface device of FIG. 3A;

FIGS. 4A–4B are perspective views of an embodiment illustrating a locking pin wedge assembly;

DETAILED DESCRIPTION

The embodiments disclosed herein describe a system and method for creating a thermal interface that will fill a variable gap and concurrently provide efficient heat transfer properties.

Figure 1A:
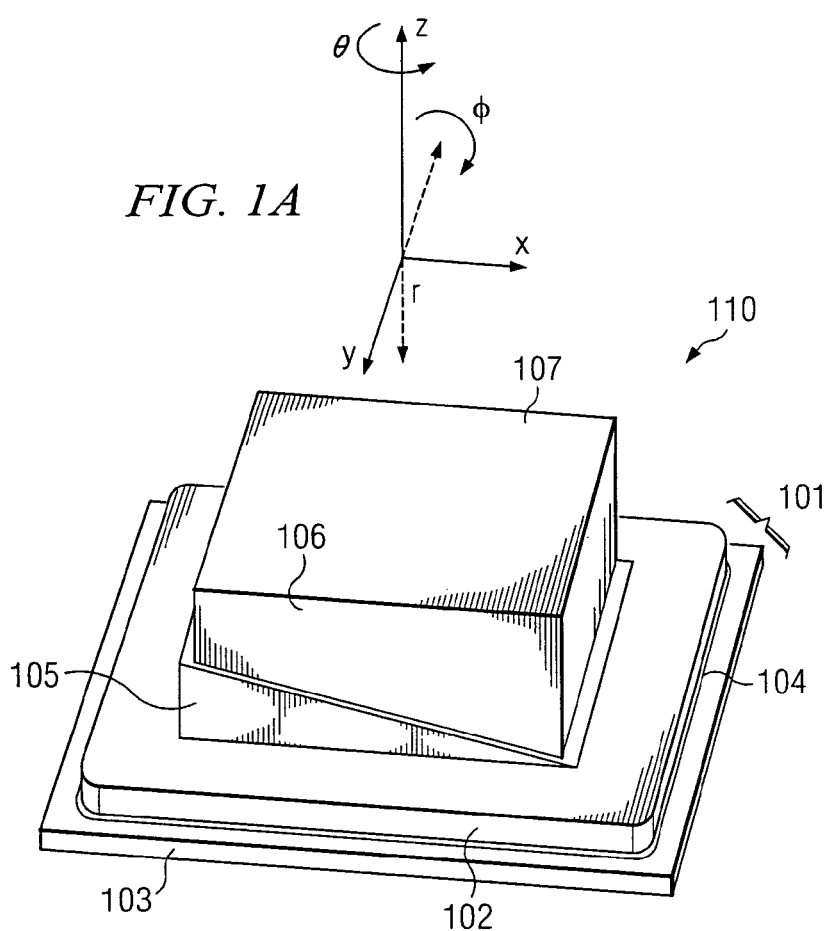
FIG. 1A is a perspective view of an embodiment illustrating a variable-wedge thermal-interface device
Figure 1B:
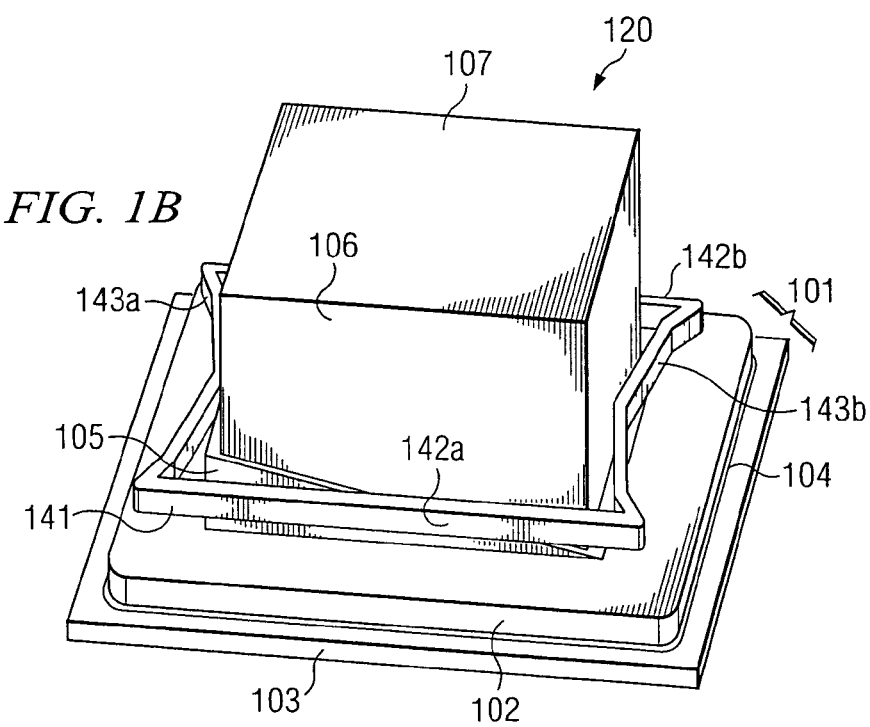
FIG. 1B is a perspective view of an embodiment illustrating a spring-loaded variable-wedge thermal-interface device, in which a spring clip is added to the thermal-interface device of FIG. 1A.

FIGS. 1A and 1B show a wedge-based variable gap thermal interface, as disclosed in co-pending and commonly assigned U.S. patent application Ser. No. 10/419,406, the disclosure of which has been incorporated herein by reference.

FIG. 1A is a perspective view of an embodiment illustrating variable-wedge thermal-interface device 110. Thermal-interface device 110 comprises heat sink extension 106 with flat upper end 107 mechanically and thermally coupled to a heat sink base (not shown in FIG. 1A). Alternatively, heat sink extension 106 may be fabricated as an integral part of the heat sink or heat sink base. For convenience, coordinate axes are shown in FIG. 1A, such that x, y, and z are orthogonal rectangular axes fixed with respect to heat sink extension 106 and rotating through angular coordinates 0 and (p about the respective z and y axes. Heat sink extension 106 has a lower flat face inclined at a wedge angle relative to the x-axis in the example of FIG. 1A.

Lower wedge element 105 has an upper surface inclined at the same wedge angle and making sliding contact with the lower inclined flat face of heat sink extension 106. Although the lower flat face of lower wedge element 105 can be inclined at any angle relative to the xyz rotating coordinate system, for convenience in the example of FIG. 1A it is oriented parallel to the rotating xy plane. Likewise, although the lower flat face of lower wedge element 105 can be inclined at any angle relative to flat upper end 107 of heat sink extension 106, for convenience in the example of FIG. 1A it is oriented parallel to flat upper end 107. Lower wedge element 105 is coupled thermally and mechanically to heat source 101 and thus provides efficient heat transfer from heat source 101 through solid, high thermal-conductivity material of lower wedge element 105 and heat sink extension 106 to the heat sink base. The sliding-contact interface between lower wedge element 105 and heat sink extension 106 may be filled with a conformal thermal-interface material, typically thermal grease or paste, to reduce both thermal resistance and friction. Heat source 101, as shown in the example of FIG. 1A, includes processor chip 104, processor lid 102, and circuit board 103.

FIG. 1B is a perspective view of an embodiment illustrating spring-loaded variable-wedge thermal-interface device 120, in which spring clip 141 is added to thermal-interface device 110 of FIG. 1A. A wedge-based thermal-interface device including a spring clip is disclosed in co-pending and commonly assigned U.S. patent application Ser. No. 10/419,406, the disclosure of which has been incorporated herein by reference. In the example of FIG. 1B, wedge element 105 and heat sink extension 106 are spring-loaded together in the x-direction by spring clip 141. In one variation, spring clip 141 is shaped approximating a deformed rectangular frame. Two opposing sides 142a, 142b may be but need not necessarily be straight and parallel as shown in FIG. 1B. Two alternating opposing sides 143a, 143b are typically bent inward toward one another and are pre-stressed to exert a compressive force toward one another.

In spring-loaded variable-wedge thermal-interface device 120, spring clip 141 is aligned, so that a first inwardly bent side, for example side 143a, presses against the largest area vertical surface (aligned normal to the x-axis) of wedge element 105, and a second inwardly bent side, for example side 143b, presses against the largest area vertical surface (also aligned normal to the x-axis) of heat sink extension 106. The combined compressive forces applied by spring clip 141 to wedge element 105 and heat sink extension 106 generate shear force components across the inclined interface between wedge element 105 and heat sink extension 106, urging the contacting inclined interface surfaces of wedge element 105 and heat sink extension 106 to slide relative to one another, thereby driving wedge element 105 to expand the z-axis length of spring-loaded variable-wedge thermal-interface device 120 to fill the available gap between heat sink extension 106 and heat source 101. This simultaneously drives wedge element 105 along the x-axis to become offset relative to heat sink extension 106, thereby somewhat reducing the inclined surface contact area. When the z-axis gap is filled, z-axis compressive forces prevent further offset between wedge element 105 and heat sink extension 106. Spring clip 141 may be used similarly to apply shear forces to sliding wedge elements in other applications, including both heat transfer and non-heat transfer applications. Optionally, spring clip 141 may be attached to one of the wedge elements using a screw, bolt, or other traditional fastener.

FIG. 2 is a perspective view of an embodiment illustrating cascaded variable-wedge thermal-interface device 200, in which two or more wedge structures similar to variable-wedge thermal-interface devices 110 and 120 depicted in FIGS. 1A and 1B are stacked or cascaded in the z-direction. For purposes of illustration, in the example of FIG. 2 are depicted two such wedge structures having inclined wedge interfaces 215 and 216 oriented at a 90-degree rotation angle about the z-axis relative to one another. In other implementations, arbitrary numbers of wedge structures may be stacked at arbitrary orientations relative to one another. For most applications, however, there is little or no advantage achieved by increasing the number of cascaded wedge structures beyond two.

In the example depicted in FIG. 2, wedge interface 215, formed between lower wedge element 205 and second wedge element 206, is inclined to provide offset motion along the x-direction, whereas wedge interface 216, formed between second wedge element 206 and heat sink extension 207, is inclined to provide offset motion along the y-direction. Lower surface 204 of lower wedge element 205 is typically flat and is coupled thermally and mechanically with a heat source, for example heat source 101 in FIGS. 1A and 1B, whereas heat sink extension 207 typically has a flat upper surface, but is typically coupled thermally and mechanically with a heat sink (not pictured). The upper surface of heat sink extension 207 is typically but not necessarily parallel to lower surface 204. Alternatively, heat sink extension 207 may be fabricated as an integral part of a heat sink or heat sink base. Multiply-cascaded wedge thermal interfaces, for example wedge interfaces 215 and/or 216, may be spring-loaded under shear force, for example using spring clips, as represented by spring clip 141 in FIG. 1B.

Co-pending and commonly assigned U.S. patent application Ser. No. 10/419,406, the disclosure of which has been incorporated herein by reference, discloses a variable-wedge thermal-interface device that includes a multi-axis rotary spherical joint. This implementation is particularly advantageous for multi-axis angular adjustment in a situation in which the heat source and the heat sink may lie in non-parallel planes and/or where the distance between heat source and heat sink is non-uniform. This situation arises frequently when attempting to conduct heat from multiple heat sources to a single heat sink.

FIG. 3A is a perspective view of an embodiment illustrating assembled variable-height thermal-interface device 300, including at least one single-axis rotary cylindrical joint 315a–315b, 316a–316b. FIG. 3B is an exploded perspective view of an embodiment illustrating variable-height thermal-interface device 300. FIGS. 3A–3B depict a variable-height thermal-interface device 300 including two cascaded cylindrical joints 315a–315b and 316a–316b oriented orthogonally relative to one another about the z-axis and having respective cylinder axes 325 and 326 each inclined relative to the x-y plane. In general, variable-height thermal-interface devices, in accordance with the disclosed embodiments, may contain from one cylindrical joint to any number of cascaded cylindrical joints, each of which may be oriented at any angle(s) about the z-axis relative to any other cylindrical joint, and each of which may have a cylinder axis oriented parallel with the x-y plane or inclined at any angle relative to the x-y plane.

In the example embodiment depicted in FIGS. 3A and/or 3B, cylindrical joint 315a–315b is formed at the sliding interface between concave upper surface 321 of lower element 305 and convex lower surface 322 (hidden in FIG. 3B) of second element 306. Concave surface 321 and convex surface 322 have radii of curvature matched to one another, represented by broken-line arrow 335, centered at cylinder axis 325. Concave surface 321 is rotatably slidable relative to convex surface 322 about cylinder axis 325, as represented by curved arrows $\alpha_1$, providing single-axis bending capability in variable-height thermal-interface device 300. Orthogonally, concave surface 321 is linearly slidable parallel to cylinder axis 325 relative to convex surface 322, as represented by linear arrows $\pm\Delta_1$, providing single-axis translation capability in variable-height thermal-interface device 300.

Cylindrical joint 316a–316b is similarly formed at the sliding interface between concave upper surface 323 of second element 306 and the convex lower surface 324 (hidden in FIG. 3B) of heat sink extension 307. Concave surface 323 and convex surface 324 have radii of curvature matched to one another, represented by broken-line arrow 336, centered at cylinder axis 326. Concave surface 323 is rotatably slidable relative to convex surface 324 about cylinder axis 326, as represented by curved arrows $\alpha_2$, providing single-axis bending capability in variable-height thermal-interface device 300. Orthogonally, concave surface 323 is linearly slidable, parallel to cylinder axis 326 relative to convex surface 324, as represented by linear arrows $\pm\Delta_2$, providing single-axis translation capability in variable-height thermal-interface device 300.

Radii of curvature 335 and 336 may be but need not necessarily be matched between different joints of the same variable height thermal interface device. Cylinder axes 325, 326 may be parallel to the x-y plane or may be oriented or inclined at any angle relative to the x-y plane and/or relative to one another. Cylindrical joints having cylinder axes so inclined may interface wedged elements, such that relative translation between interfacing elements provides z-axis expansion of the variable height thermal interface device. Interfacing elements of a cylindrical joint may optionally be spring-loaded for shear force across the interface, facilitating z-axis expansion in a manner similar to spring-loaded variable-wedge thermal-interface device 120 depicted in FIG. 1B. As in the case of variable height thermal interface devices previously described herein, the interfaces between contacting cylindrical surfaces may be filled with a thermal-interface material, typically thermal grease or paste, to reduce both thermal resistance and sliding friction.

Two stacked or cascaded orthogonally oriented cylindrical joints provide the same degrees of bending motion as those provided by a single rotary spherical joint. Advantages of a cylindrical-joint variable thermal interface implementation include:

First, a cylindrical surface is much easier to fabricate than a sphere. A cylindrical surface can be machined using many methods, including any of the following methods:

Horizontal form milling;
Crush-form grinding;
Diamond dress grinding (traditional method of grinding bearing raceways);
Fly-cutting, where the path of the part is at an oblique angle to the axis of the fly-cutter. This will in reality create a surface that is not quite cylindrical, but rather elliptical. Modeling has shown that the deviation between the surfaces can be less than 1.5 nanometers (nm), when the rotation range required for heat source tilt is considered.

The cost of machining a bearing raceway is $0.05 to $0.10 per cut. If all three elements of a variable height thermal interface device were made of copper, about 32 grams of copper would be required, at a total material cost of about $0.22. The cost of machining each of the six required cuts is ~$0.60. An assembly could then cost less than a dollar.

Second, with two stacked inclined cylindrical joints, the vertical travel can be taken up by both of the effective wedges. This doubles the vertical travel range of the variable thermal interface. In accordance with the embodiments disclosed herein, a variable height thermal interface device may include from one to any number of stacked cylindrical joints, spherical joints, wedge interfaces, or any combination of these three structures. A cylindrical or spherical joint provides respectively uniaxial or multi-axial compensation for misalignment between a heat source and a heat sink, whereas a wedge interface provides variable height z-axis gap compensation between the heat source and heat sink. An inclined-axis cylindrical joint provides hybrid capabilities of a cylindrical joint combined with a wedge interface.

In the spring-loaded wedge-based thermal interface device depicted in FIG. 1B, prior to installation, the wedge elements are at their extended z-axis position under spring loading. In their pre-loaded condition, the thermal interface device is overextended and consequently overfills the z-axis gap between the heat source and the heat sink. As the wedge components are pressed against the heat source, the wedge elements must slide against both friction and spring force to fit within the available gap between the heat source and the heat sink.

However, if a reversible locking device in its locked condition holds the wedge components in their most retracted position until installation has occurred, and then in its unlocked condition allows the wedge components to move, the shear force from the spring clip is released. This causes the wedge components to slide relative to one another against friction, but with and not against the spring force. This sliding motion is coupled to z-axis expansion of the variable height thermal interface device, which fills the gap between the heat source and the heat sink. This assembly method is advantageous, because lower forces are needed during installation. A locking pin, as described below in more detail, is one implementation of a reversible locking device, in accordance with embodiments disclosed herein.

Figure 4B:
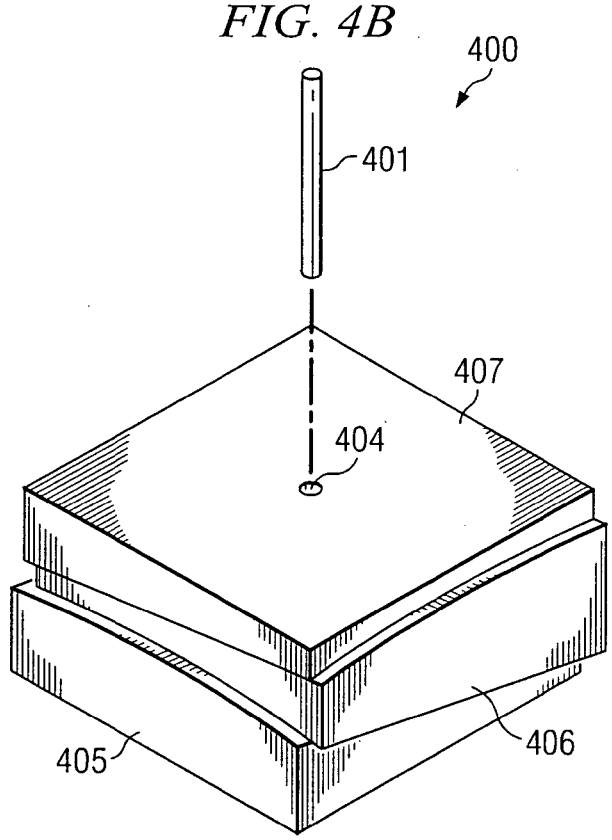

FIGS. 4A–4B are perspective views of an embodiment illustrating locking pin wedge assembly 400, configured to keep wedge components 405–407 in their retracted state during installation. A through clearance hole 402–404 is formed in each respective wedge component 405–407. Through clearance holes 402–404 align with one another when wedge components 405–407 are in their most retracted position, as illustrated in FIGS. 4A–4B. Locking pin 401 is then inserted through the series of aligned through clearance holes 402–404 to lock wedge components 405–407 in their most retracted position relative to one another during the installation process.

Figure 4C:
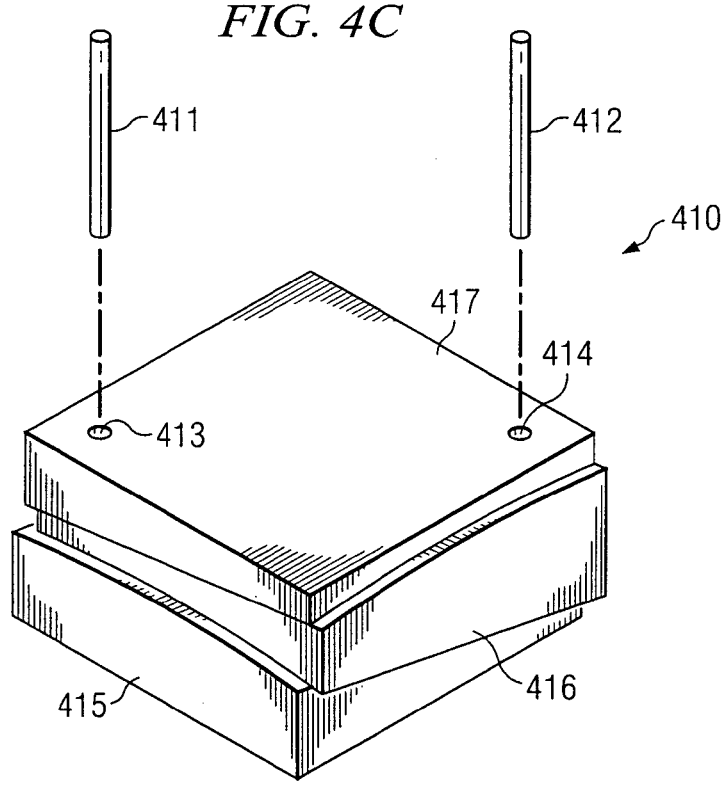
FIG. 4C is a perspective view of an embodiment illustrating a variation of the locking pin wedge assembly of FIGS. 4A–4B.

FIG. 4C is a perspective view of an embodiment illustrating another variation of locking pin wedge assembly 400. FIG. 4C depicts locking pin wedge assembly 410, in which two through clearance holes 413, 414 are formed in diagonally opposite corners of wedge component 417. Two aligned similar through clearance holes (hidden in FIG. 4C) are formed in each of remaining wedge components 415, 416. When wedge components 415–417 are in their most retracted position, both through clearance holes of each wedge component align with two counterpart through clearance holes, for example, through clearance holes 413, 414, in each of the other wedge components, providing two series of aligned through clearance holes. Locking pins 411, 412 are then each inserted at opposite corners through each of the two series of through holes 413, 414, and respective counterpart aligned through holes, to hold wedge components 415–417 in their most retracted position relative to one another during the subsequent installation process. This implementation is advantageous for at least two reasons: First, the corner positions of through holes 413, 414, and respective counterpart aligned through holes, create negligible adverse effect on heat transfer performance, since the center of wedge assembly 410 is the most critical region, and the corners of wedge assembly 410 are the least critical regions of heat transfer. Second, insertion of two locking pins 411, 412 maintains not only single-axis alignment, but also a rigid orientation in the x-y plane of wedge components 415–417 relative to one another.

In accordance with the embodiments disclosed herein, the principles of locking pin wedge assemblies 400 and 410 illustrated in FIGS. 4A–4C may be extended to include any multiple number of locking pins, each of which is insertable into and withdrawable from its respective series of through holes. The through holes in each respective series are aligned with one another when the wedge components are in their most retracted position relative to one another. Likewise, wedge assemblies including three wedge components, as shown by wedge assemblies 400 and 410 in FIGS. 4A–4C, may be extended to include multiple-stacked wedge components having multiple-stacked wedge interfaces. Each such stacked wedge component includes, for example, one through clearance hole for each insertable locking pin. Corresponding holes in each stacked wedge component align with one another when the wedge components are in their most retracted relative position.

After the wedge assembly, for example locking pin wedge assembly 400 or 410, has been installed between the heat source and the heat sink, the locking pin 401 or pins 411, 412 are withdrawn, unlocking and releasing the wedge components. When this occurs, the spring clips that load the wedge interfaces will force the released wedge components to slide relative to one another, thus expanding the wedge assembly in the z-direction to fill the gap.

Figure 5A:
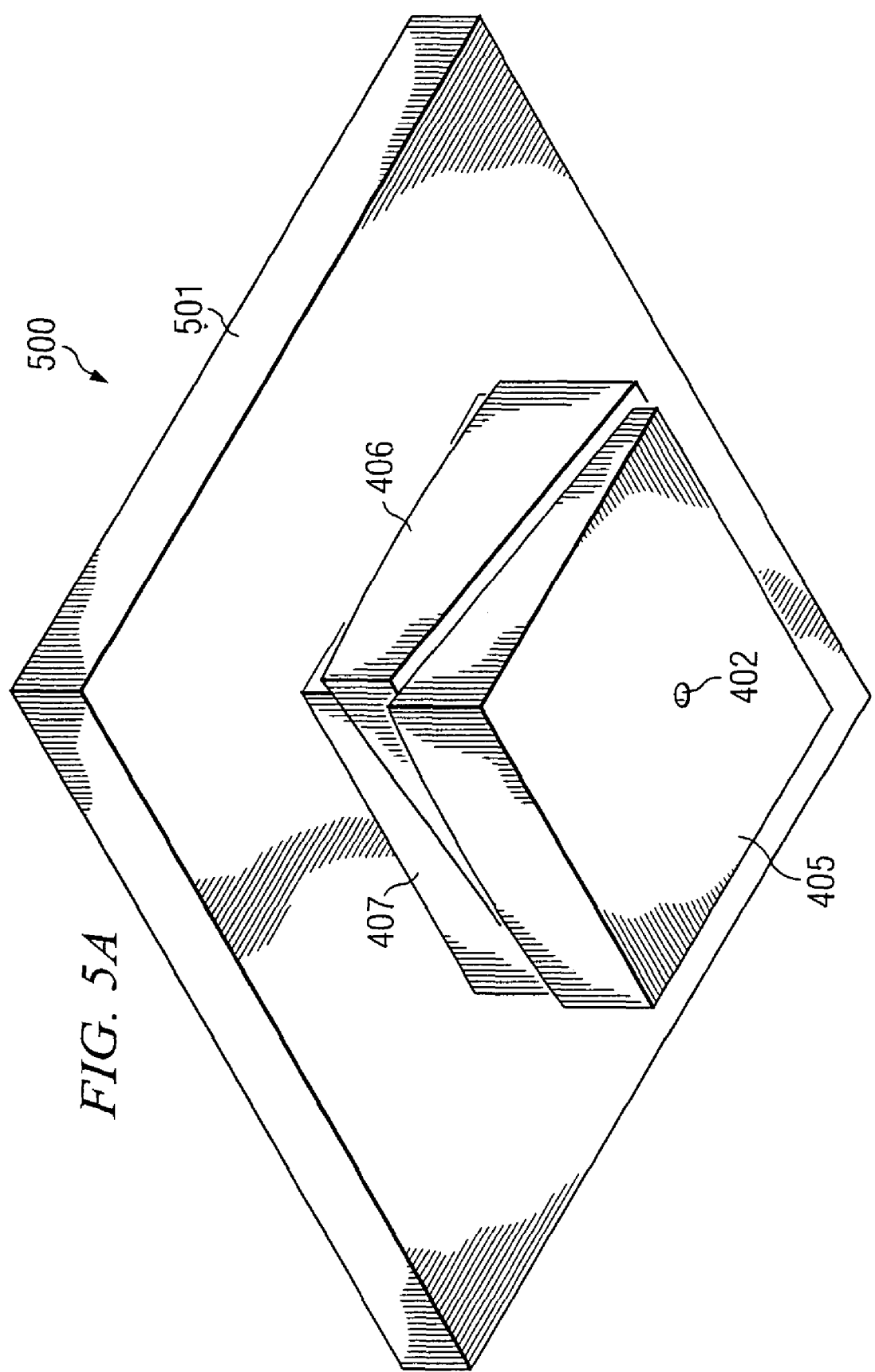
FIGS. 5A–5C are perspective views of embodiments illustrating a wedge assembly implementation, in which a heat sink base is installed in thermal contact with a heat sink extension, and is provided with a through hole aligned with through holes in the wedge assembly and providing clearance for a locking pin.
Figure 5B:
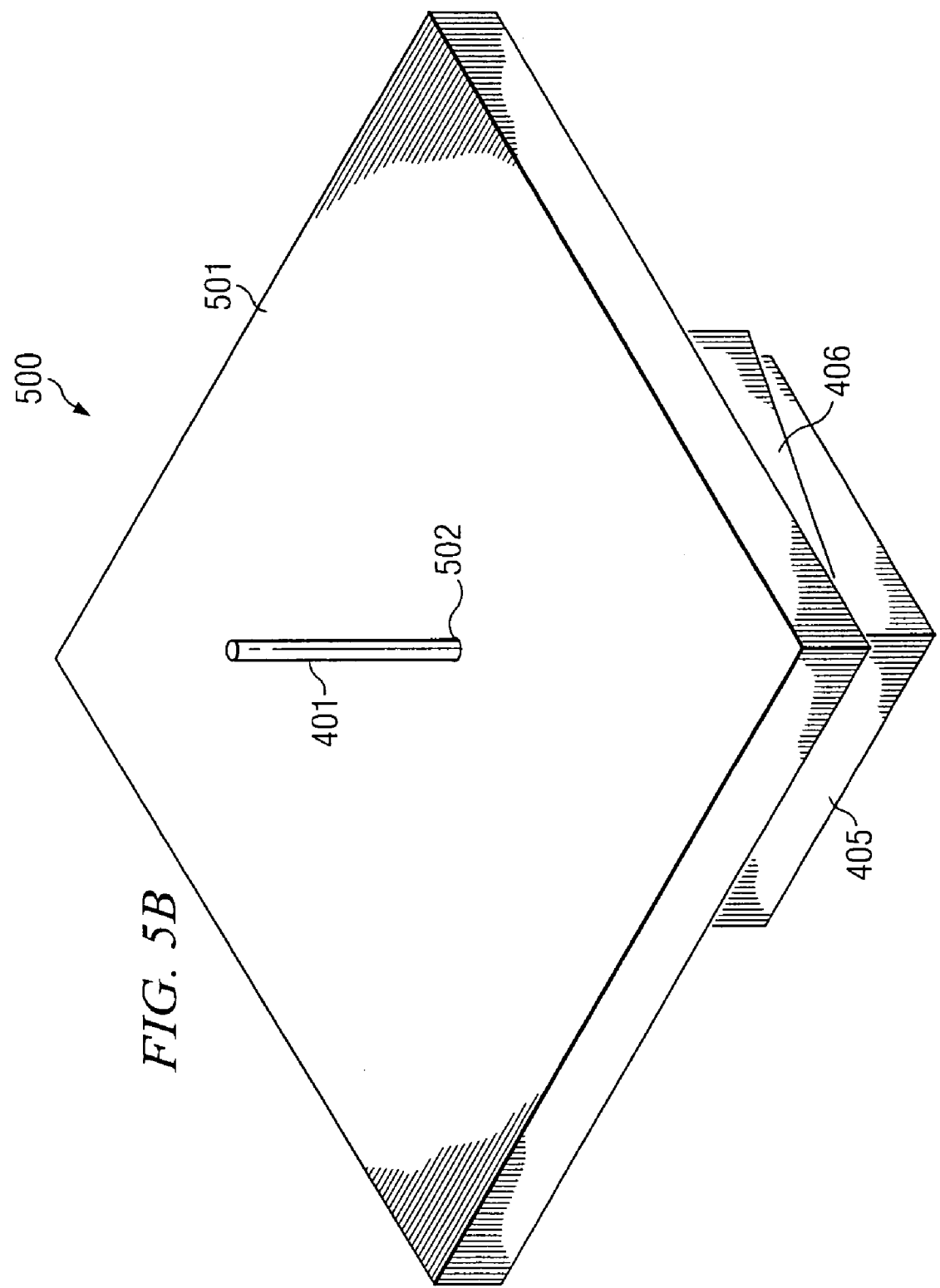
Figure 5C:
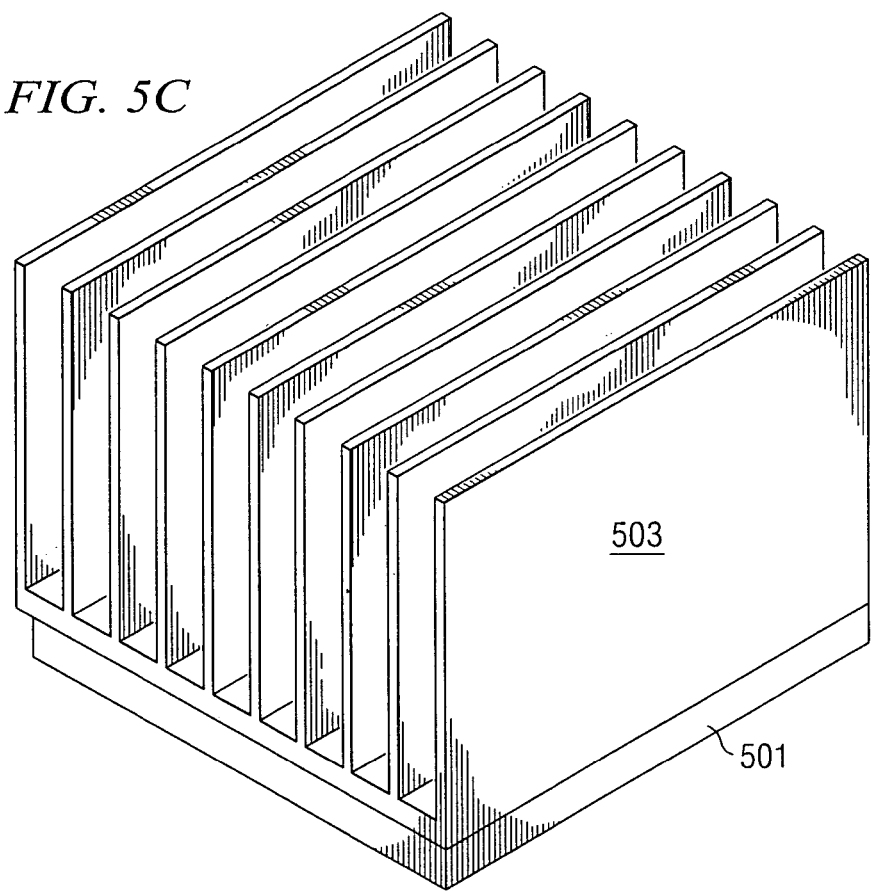

In some embodiments, the locking pin(s) may be made sufficiently long, so that they protrude from the wedge assembly. FIGS. 5A–5C are perspective views of embodiments illustrating wedge assembly implementation 500, in which heat sink base 501 is installed in thermal contact with heat sink extension 407, and is provided with a through hole 502 aligned with through holes 402–404 and providing clearance for locking pin 401. Heat sink body 503, however, is not provided with such a clearance hole, and therefore cannot be installed in contact with heat sink base 501 with locking pin 401 in place. Consequently, locking pin 401 must be withdrawn, before the heat sink body 503 can be installed, as shown in FIG. 5C. This elongated locking pin configuration will prevent an operator from forgetting to remove locking pin 401 after wedge assembly 400 is mechanically and thermally coupled with a heat source, for example heat source 101. The locking pin concept illustrated in FIGS. 4A–5B may also be applied to alternative spring-loaded thermal interface assemblies, for example thermal interface assemblies that include one or more inclined-axis cylindrical joints, as described in connection with FIGS. 3A–3B, which exhibit properties similar to wedge elements.

Figure 6:
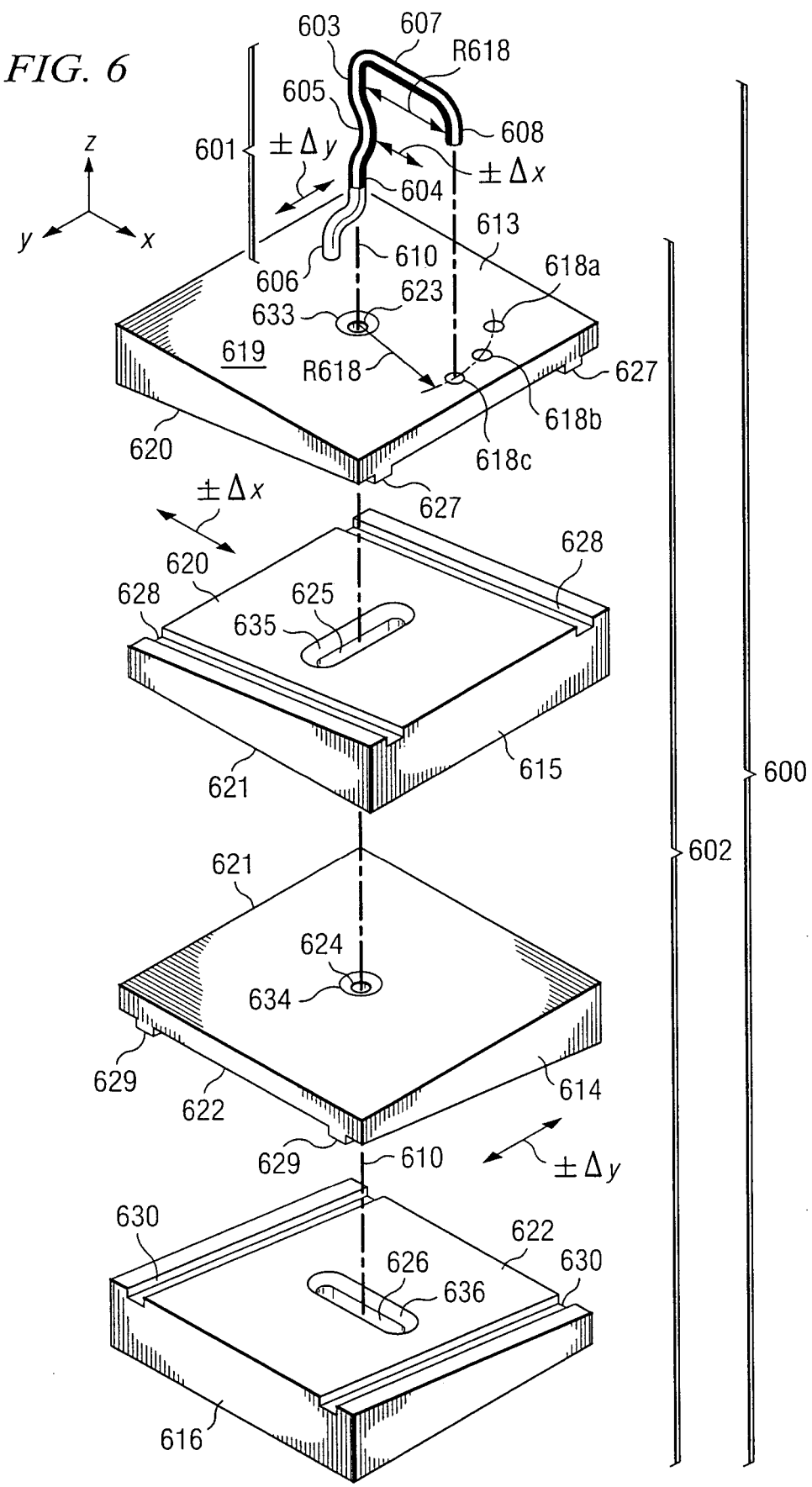
FIG. 6 is an exploded perspective view of an embodiment illustrating an alternative type of reversible locking device.

FIG. 6 is an exploded perspective view of an embodiment illustrating an alternative type of reversible locking device. For convenience, coordinate directions are shown by x, y, and z axes. Locking cam assembly 600 includes locking cam 601 and wedge-based thermal interface assembly 602 having wedge elements 613–616 depicted in alignment with camshaft rotation axis 610. Locking cam 601 can provide not only reversible locking but also spring loading, such that it can perform the functions of both locking pin 401 and spring clip 141. Locking cam 601 includes cylindrical camshaft bearing surfaces 603 and 604 concentric with camshaft rotation axis 610 and eccentric cam 605 oriented to convert rotational motion about camshaft rotation axis 610 to linear motion of wedge interface 620 between wedge elements 613 and 615. In some embodiments, locking cam 601 includes additional eccentric cams, for example eccentric cam 606 oriented to convert rotational motion about camshaft rotation axis 610 to linear motion of wedge interface 622 between wedge elements 614 and 616. Eccentric cams 605 and 606 are oriented at 90 degrees relative to one another about camshaft rotation axis 610, such that the resulting linear motions of wedge interfaces 620 and 622 are oriented at 90 degrees relative to one another. Locking cam 601 can also include radial handle element 607 ending in hook 608 at a radial distance R618 from camshaft rotation axis 610.

In operation, camshaft 603–606 is inserted in sequence through respective holes and slots 623, 625, 624, and 626 in respective wedge elements 613, 615, 614, and 616. Then handle element 607 rotates camshaft 603–606, causing eccentric cams 605 and 606 to bear against the walls of respective slots 625 and 626. In the example illustrated in FIG. 6, eccentric cam 605 causes wedge element 615 to move linearly in the x-direction, as shown by arrows labeled ±Δx, and cam 606 causes wedge element 616 to move linearly in the y-direction, as shown by arrows labeled ±Δy. Assembly and operation may be facilitated by thinning respective wedge elements 613, 615, 614, and 616 adjacent to the respective hole or slot, for example as illustrated by spot faces 633, 635, 634, and 636. This maximizes the range of motion without binding of eccentric cams 605, 606 against holes or slots 623, 625, 624, and 626 during insertion or rotation. There may be a significant amount of free play in the slotted direction between slots 625, 626 and corresponding cams 605, 606. Alignment surfaces, for example tongue and groove structures 627, 628 and 629, 630 as shown in interfaces 620 and 622, may be included to confine motion along the respective x-direction or y-direction. Care should be taken to insure the precision of the alignment surfaces, so that gaps between the contacting alignment surfaces in the wedge interfaces are minimized. Typically, a single tongue sliding in a single groove is adequate to confine relative motion along a desired axis under load between two contacting wedge interface surfaces. Typically, alignment surfaces are not needed on interface 621, since the motions of wedge elements 614 and 615 are aligned relative to respective wedge elements 616 and 613.

If wedge-based thermal interface assembly 602 is in a fully retracted condition with the orientation of locking cam 601 as shown in FIG. 6, then rotation of handle element 607 through 180 degrees about camshaft rotation axis 610 will drive wedge-based thermal interface assembly 602 into a fully inserted condition, which provides maximum z-axis expansion of wedge-based thermal interface assembly 602. To lock wedge-based thermal interface assembly 602 in this condition, a hole or detent 618a–618c is provided in top surface 619 along an arc having radius R618 concentric with camshaft rotation axis 610. The combination of stiffness of handle element 607 and length of hook 608 can be selected, such that hook 608 can lock into detent 618a–618c under z-direction spring loading from handle element 607. This locking can be reversed, for example, if an operator manually pulls up on hook 608 against the z-direction spring loading from handle element 607. Similarly, by controlling the stiffness of handle element 607, a predetermined amount of xy-plane spring loading is applied from hook 608 captured within detent 618a–618c through handle element 607 to provide a spring-loaded torque about camshaft 603–606, which is then transferred through eccentric cams 605, 606 as a spring-loaded linear force against respective wedge elements 615, 616. If more than one combination of z-axis position and spring loading is desired, then an array of detents 618a–618c located as appropriate along arc of radius R618 can be provided for locking handle element 607. Unlike locking pin 401, locking cam 601 remains locked in place in locking cam assembly 600 after installation between a heat source and a heat sink. Therefore locking cam 601 does not need to be unlocked or removed following installation.

Accordingly, locking cam assembly 600 provides not only reversible locking but also spring loading, and as such can perform the functions of both locking pin 401 and spring clip 141.

Wedge-based variable thermal-interface devices, for example variable thermal interface devices 200, 300, 400, and 410 are potentially scalable dimensionally over a range from nanometers (nm) to meters.

Figure 7:
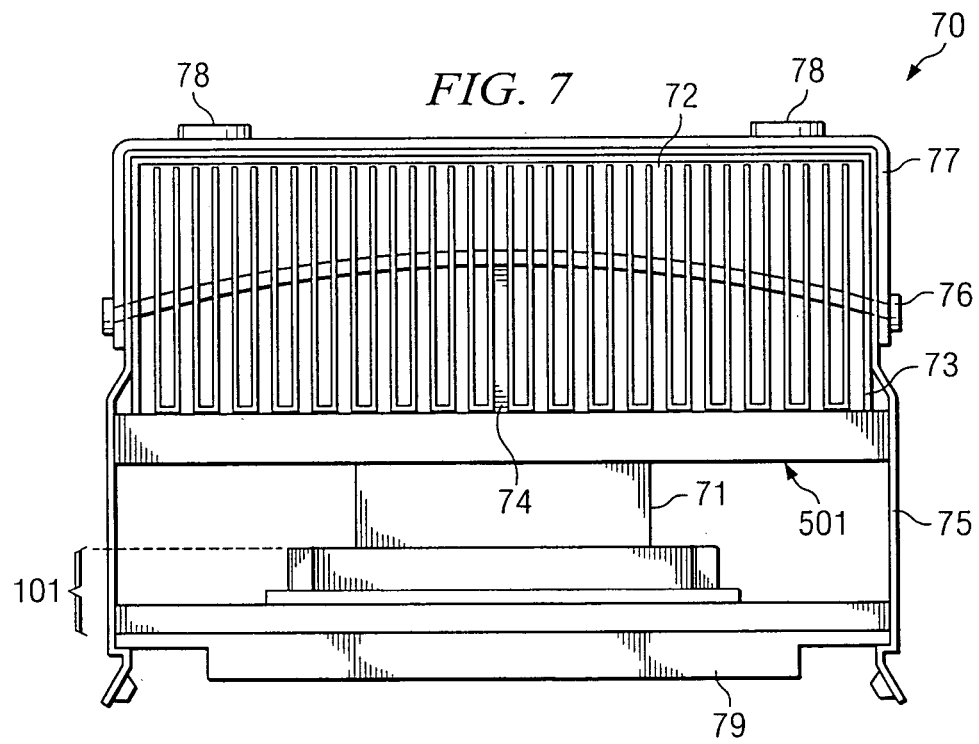
FIG. 7 is a schematic diagram of an embodiment illustrating a heat sink hold-down device, in accordance with a disclosure incorporated herein.

In practice, the compressive load between the heat sink base and bolster plate in any of the embodiments disclosed herein can be provided by any of a variety of heat sink hold-down devices. An advantageous configuration of such a hold-down device is disclosed in co-pending and commonly assigned U.S. patent application Ser. No. 10/419,386, the disclosure of which has been incorporated herein by reference. FIG. 7 is a schematic diagram of an embodiment illustrating heat sink hold-down device 70, in accordance with the above-incorporated disclosure. Bolster plate 79 supports heat source 101. Heat sink 73 includes heat sink base 501 attached to central post 74, and finned structure 72. Cage 75 is attached with clips to bolster plate 79 and supports lever spring 76 through clearance slots. Cap 77 rigidly attached to cage 75 using screws or other fasteners 78 presses downward on the ends of lever spring 76, which transfer the load through a bending moment to central post 74. Central post 74 is disposed to distribute the load symmetrically across the area of heat sink base 501.

In some embodiments, heat sink extension 71 transfers the compressive loading between heat sink base 501 and heat source 101. Alternatively, a variable-height thermal-interface device in accordance with the present embodiments, for example variable-height thermal-interface device 110, 120, 200 or cylindrical joint variable-height thermal-interface device 300, is coupled thermally and mechanically with heat sink hold-down device 70, replacing at least in part heat sink extension 71. In this configuration, heat sink hold-down device 70 applies the loading that holds variable-height thermal-interface device 110, 120, 200 or cylindrical joint variable-height thermal-interface device 300 under compression against heat source 101.

Embodiments disclosed herein address the problem of minimizing the thermal resistance between a heat source and a heat sink for a situation in which the heat source and the heat sink may lie in non-parallel planes and/or where the distance between heat source and heat sink is non-uniform. This is a problem that arises especially when attempting to conduct heat from more than one heat source to a single heat sink.

What is claimed is:

1. A variable-height thermal-interface assembly for transferring heat from a heat source to a heat sink, said assembly comprising:
    a first slidable interface between two contacting surfaces, said slidable interface inclined diagonally relative to a z-axis parallel to the shortest distance between said heat source and said heat sink, said two contacting surfaces operable to slide relative to one another parallel to the direction of said incline to provide z-axis expansion of said thermal interface assembly;
    a spring clip mechanically spring loading said slidable interface, said spring clip operable when released to apply a shear force across said slidable interface, said shear force causing said two contacting surfaces to slide relative to one another, coupling said sliding to provide said z-axis expansion; and
    a reversible locking device, operable when in a locked condition to prevent said two contacting surfaces from sliding relative to one another, such that said spring clip remains retracted, and operable when in an unlocked condition to allow said two contacting surfaces to slide relative to one another, such that said spring clip is released.

2. The assembly of claim 1 wherein:
said first slidable interface comprises a first uniaxial rotary cylindrical joint comprising a first cylindrically concave surface in slidable contact with a first cylindrically convex surface, said first cylindrically concave surface and said first cylindrically convex surface having a common first radius of curvature relative to a common first cylinder axis;
said first cylindrically concave surface operable to rotate about said common first cylinder axis relative to said first cylindrically convex surface to compensate for uniaxial angular misalignment between said heat source and said heat sink.

3. The assembly of claim 1 wherein said spring clip is shaped approximating a deformed rectangular frame, comprising:
a first side and a second side opposite said first side, wherein said first and second sides are bent inward toward one another;
said first side operable to couple a compressive force substantially parallel to said first cylindrically concave surface; and
said second side operable to couple an oppositely directed compressive force to said first cylindrically convex surface.

4. The assembly of claim 2, further comprising:
a second uniaxial rotary cylindrical joint comprising a second cylindrically concave surface in slidable contact with a second cylindrically convex surface, said second cylindrically concave surface and said second cylindrically convex surface having a common second radius of curvature relative to a common second cylinder axis;
said second cylindrically concave surface operable to rotate about said common second cylinder axis relative to said second cylindrically convex surface to compensate for uniaxial angular misalignment between said heat source and said heat sink.

5. The assembly of claim 4 wherein:
the orientation about said z-axis of said common first cylinder axis is different relative to the orientation of said common second cylinder axis about said z-axis; and
said first and said second uniaxial rotary cylindrical joints are operable to rotate cooperatively to compensate for biaxial angular misalignment between said heat source and said heat sink.

6. The assembly of claim 4 wherein:
said common first cylinder axis and said common second cylinder axis are each inclined diagonally relative to the z-axis parallel to the shortest distance between said heat source and said heat sink; and
said first and said second uniaxial rotary cylindrical joints are each operable to slide linearly to provide combined z-axis expansion of said variable height thermal interface assembly equivalent, to the sum of the z-axis expansions of said individual first and second uniaxial rotary cylindrical joints.

7. The assembly of claim 1 wherein said first slidable interface comprises a wedge interface having a first planar surface in slidable contact with a second planar surface, said slidably contacting planar surfaces inclined diagonally relative to the z-axis parallel to the shortest distance between said heat source and said heat sink, said wedge interface operable to provide z-axis expansion of said variable height thermal interface assembly.

8. The assembly of claim 1 further comprising a multi-axis rotary spherical joint operable to compensate for multi-axis angular misalignment between said heat source and said heat sink.

9. The assembly of claim 1 further comprising a shim operable to provide z-axis expansion of said variable height thermal interface assembly.

10. The assembly of claim 1 further comprising a conformal thermal-interface material applied to interface surfaces within said thermal interface assembly.

11. The assembly of claim 1 wherein said contacting surfaces consist substantially of high thermal conductivity solid materials.

12. The assembly of claim 1 wherein said reversible locking device comprises a locking pin insertable into and withdrawable from a series of through holes formed through said two contacting surfaces, said through holes in alignment with one another when said two contacting surfaces are retracted relative to one another.

13. The assembly of claim 12 wherein said reversible locking device comprises a plurality of said locking pins insertable into and withdrawable from a plurality of series of said aligned through holes formed through said two contacting surfaces.

14. The assembly of claim 12 wherein said locking pin is operable to prevent completion of installation of said thermal interface assembly while said locking pin is inserted.

15. The assembly of claim 14 wherein said inserted locking pin is elongated and protrudes relative to said assembly, such that said elongated locking pin prevents installation of a heat sink.

16. A method of installing a variable-height thermal-interface assembly for transferring heat from a heat source to a heat sink, said method comprising:
providing a first slidable interface between two contacting surfaces, said slidable interface inclined diagonally relative to a z-axis parallel to the shortest distance between said heat source and said heat sink, said two contacting surfaces operable to slide relative to one another parallel to the direction of said incline to provide z-axis expansion of said thermal interface assembly;
spring loading said slidable interface using a spring clip to apply a shear force across said slidable interface;
retracting said spring-loaded slidable interface to its most retracted condition;
locking said retracted spring-loaded slidable interface reversibly in its most retracted condition;
installing said reversibly locked retracted spring-loaded slidable interface relative to said heat source; and
unlocking said reversibly locked retracted spring-loaded slidable interface, releasing said spring-loaded shear force, causing said two contacting surfaces to slide relative to one another, coupling said sliding to provide z-axis expansion of said thermal interface assembly.

17. The method of claim 16 wherein:
said first slidable interface comprises a first uniaxial rotary cylindrical joint comprising a first cylindrically concave surface in slidable contact with a first cylindrically convex surface, said first cylindrically concave surface and said first cylindrically convex surface having a common first radius of curvature relative to a common first cylinder axis;
said first cylindrically concave surface operable to rotate about said common first cylinder axis relative to said first cylindrically convex surface to compensate for uniaxial angular misalignment between said heat source and said heat sink.

18. The method of claim 16 wherein said spring clip is shaped approximating a deformed rectangular frame, comprising:
a first side and a second side opposite said first side, wherein said first and second sides are bent inward toward one another;
said first side operable to couple a compressive force substantially parallel to said first cylindrically concave surface; and
said second side operable to couple an oppositely directed compressive force to said first cylindrically convex surface.

19. The method of claim 17 further comprising:
a second uniaxial rotary cylindrical joint comprising a second cylindrically concave surface in slidable contact with a second cylindrically convex surface, said second cylindrically concave surface and said second cylindrically convex surface having a common second radius of curvature relative to a common second cylinder axis;
said second cylindrically concave surface operable to rotate about said common second cylinder axis relative to said second cylindrically convex surface to compensate for uniaxial angular misalignment between said heat source and said heat sink.

20. The method of claim 19 wherein:
the orientation about said z-axis of said common first cylinder axis is different relative to the orientation of said common second cylinder axis about said z-axis; and
said first and said second uniaxial rotary cylindrical joints are operable to rotate cooperatively to compensate for biaxial angular misalignment between said heat source and said heat sink.

21. The method of claim 19 wherein:
said common first cylinder axis and said common second cylinder axis are each inclined diagonally relative to the z-axis parallel to the shortest distance between said heat source and said heat sink; and
said first and said second uniaxial rotary cylindrical joints are each operable to slide linearly to provide combined z-axis expansion of said variable height thermal interface assembly equivalent to the sum of the z-axis expansions of said individual first and second uniaxial rotary cylindrical joints.

22. The method of claim 16 wherein said first slidable interface comprises a wedge interface having a first planar surface in slidable contact with a second planar surface, said slidably contacting planar surfaces inclined diagonally relative to the z-axis parallel to the shortest distance between said heat source and said heat sink, said wedge interface operable to provide z-axis expansion of said variable height thermal interface assembly.

23. The method of claim 16 further comprising providing a multi-axis rotary spherical joint operable to compensate for multi-axis angular misalignment between said heat source and said heat sink.

24. The method of claim 16 further comprising providing a shim operable to provide z-axis expansion of said variable height thermal interface assembly.

25. The method of claim 16 further comprising applying a conformal thermal-interface material to interface surfaces within said thermal interface assembly.

26. The method of claim 16 wherein said locking comprises inserting a locking pin into a series of through holes formed through said two contacting surfaces, said through holes in alignment with one another when said two contacting surfaces are retracted relative to one another against said spring loading.

27. The method of claim 26 wherein said locking comprises inserting a plurality of said locking pins into a plurality of said series of said aligned through holes formed through said two contacting surfaces.

28. The method of claim 26 wherein said unlocking comprises withdrawing said locking pin from said series of through holes formed through said two contacting surfaces, causing the releasing of said spring-loaded shear force.

29. The method of claim 26 wherein:
said locking pin while inserted prevents completion of installation of said thermal interface assembly; and
said locking pin when withdrawn allows completion of installation of said thermal interface assembly.

30. The method of claim 29 wherein said inserted locking pin is elongated and protrudes relative to said thermal interface assembly, such that said elongated locking pin prevents installation of said thermal interface assembly to a heat sink.

* * * * *

UNITED STATES PATENT AND TRADEMARK OFFICE
CERTIFICATE OF CORRECTION

| | | |
|---|---|---|
| PATENT NO. | : 7,120,023 B2 | Page 1 of 1 |
| APPLICATION NO. | : 10/649518 | |
| DATED | : October 10, 2006 | |
| INVENTOR(S) | : Joseph M. Whit et al. | |

It is certified that error appears in the above-identified patent and that said Letters Patent is hereby corrected as shown below:

In column 3, lines 42-43, delete "coordinates 0 and (p" and insert
-- coordinates 0 and $\varphi$ --, therefor.

In column 11, line 57, in Claim 6, after "equivalent" delete ",".

Signed and Sealed this

Twenty-third Day of December, 2008

JON W. DUDAS
*Director of the United States Patent and Trademark Office*